United States Patent [19]
Wolak et al.

[11] Patent Number: 5,544,184
[45] Date of Patent: Aug. 6, 1996

[54] SEMICONDUCTOR ILLUMINATION SYSTEM WITH EXPANSION MATCHED COMPONENTS

[75] Inventors: Edmund L. Wolak, Mountain View; John Endriz, Belmont; D. Philip Worland, San Jose; David D. Dawson, Santa Clara; Donald R. Scifres, San Jose, all of Calif.

[73] Assignee: SDL, Inc., San Jose, Calif.

[21] Appl. No.: 258,521

[22] Filed: Jun. 10, 1994

[51] Int. Cl.$^6$ .................................................. H01S 3/18
[52] U.S. Cl. ............................. 372/43; 372/33; 372/101; 257/98
[58] Field of Search ............................. 385/34; 372/43, 372/50, 33, 101; 257/98

[56] References Cited

U.S. PATENT DOCUMENTS

| | | | |
|---|---|---|---|
| 4,079,404 | 3/1978 | Comerford et al. | 357/19 |
| 5,084,895 | 1/1992 | Shimada et al. | 372/50 |
| 5,274,732 | 12/1993 | Farnand et al. | 385/34 |
| 5,315,609 | 5/1994 | Tanaka et al. | 372/33 |

FOREIGN PATENT DOCUMENTS

| | | | |
|---|---|---|---|
| 53-117392 | 10/1978 | Japan | 372/44 |
| 57-1288 | 6/1982 | Japan | 372/43 |
| 61-281577 | 12/1986 | Japan | 372/43 |
| 57-1289 | 6/1992 | Japan | 372/43 |

Primary Examiner—Rodney B. Bovernick
Assistant Examiner—Robert McNutt
Attorney, Agent, or Firm—Schneck & McHugh

[57] ABSTRACT

A semiconductor laser that includes a monolithic submount with a light emitting source aligned along one side thereby defining a radiation path over which the emitted light propagates. The submount includes two notches that flank the light emitting source. A micro-lens is mounted adjacent to the light emitting source by attaching to the submount with either epoxy or solder. Finally, the components of the semiconductor laser have matching coefficients of thermal expansion so that the optical alignment of the light emitting source and the micro-lens is maintained notwithstanding thermal cycling.

31 Claims, 2 Drawing Sheets

SEMICONDUCTOR ILLUMINATION SYSTEM WITH EXPANSION MATCHED COMPONENTS

TECHNICAL FIELD

The present invention pertains to the field of semiconductor laser packages. Specifically, the present invention pertains to optically coupling a semiconductor laser to a lens in an optical system subject to thermal cycling.

BACKGROUND ART

A micro-lens is a micro-miniature optical lens, typically having a diameter less than 3 millimeters. Micro-lenses are coming into increasing use with laser diodes and laser diode arrays. Mounting micro-lenses requires a design that will maintain the alignment of the laser source and the micro-lens, with sub-micron tolerance. In addition to requiring the micro-lens to be mounted adjacent to the edge of the laser die, many designs must ensure that the micro-lens maintains a stable position notwithstanding thermal cycling.

Much of the difficulty in mounting the lens adjacent to the laser source results from a wicking of the epoxy or solder used to mount the lens thereto. The wicking of the epoxy or solder often obscures the laser's emission aperture. A prior art attempt to mount the lens adjacent to the laser source is shown in U.S. Pat. No. 5,084,895 to Shimada et al. In Shimada et al., the lens in mounted adjacent to the laser source by etching both, in a planar fashion, onto the same substrate. In U.S. Pat. No. 4,079,904 to Comerford et al., the laser source and micro-lens are mounted onto two structural members so that they are optically coupled adjacent to one another by providing a complementary pattern of matching grooves in the members.

Further, there has been great difficulty, in the past, with maintaining the optical alignment of the laser source and the micro-lens over a change in temperature. Often, the laser source and micro-lens will become misaligned due to differences in the magnitude of expansion of the materials from which they are manufactured. If the thermally induced mismatch causes the lens, its support, or its bonding material (i.e. epoxy) to distort permanently, the excess lens material will cause it to "sag". If the lens and mount combinations change temperature (which may be the case under some operation condition), the thermal expansion mismatches between the lens and its mount can also cause sagging. This results in a substantial loss in illumination intensity, a reduction in beam quality or a change in beam direction.

The amount of "sag" that is acceptable depends upon the parameters of the microlens. For example, shaped microlenses can tolerate misalignments of 1 micrometer or less. Cylindrical microlenses typically have tolerances of 1 to 10 micrometers. However, the prior art has failed to provide a structure that maintains the alignment of the micro-lens with the laser source of a semiconductor laser assembly subjected to a change in temperature, i.e., thermal cycling.

DISCLOSURE OF THE INVENTION

It is the object, therefore, of the present invention to provide an improved semiconductor illumination system that maintains the alignment of the system's components notwithstanding thermal cycling.

It is a further object of the present invention to provide a semiconductor illumination system whereby the system's components may be aligned easily with submicron tolerance.

These objectives have been achieved by providing a monolithic submount with the front surface serving as the mechanical reference point of both the illumination source and the micro-lens attached thereto. The components of the illumination system are expansion matched so that they maintain alignment notwithstanding thermal cycling. The submount includes two notches flanking the illumination source. The notches prevent epoxy, solder or other lens mount material from obstructing the radiation path. If the micro-lens is soldered to the submount, the notches isolate the thermal energy associated with soldering. In addition, the notches facilitate proper diode registration on the submount.

BRIEF DESCRIPTION OF THE DRAWINGS

FIG. 1b is a front view of the semiconductor lumination system shown in FIG. 1a.

BEST MODE FOR CARRYING OUT THE INVENTION

Figure 1A:
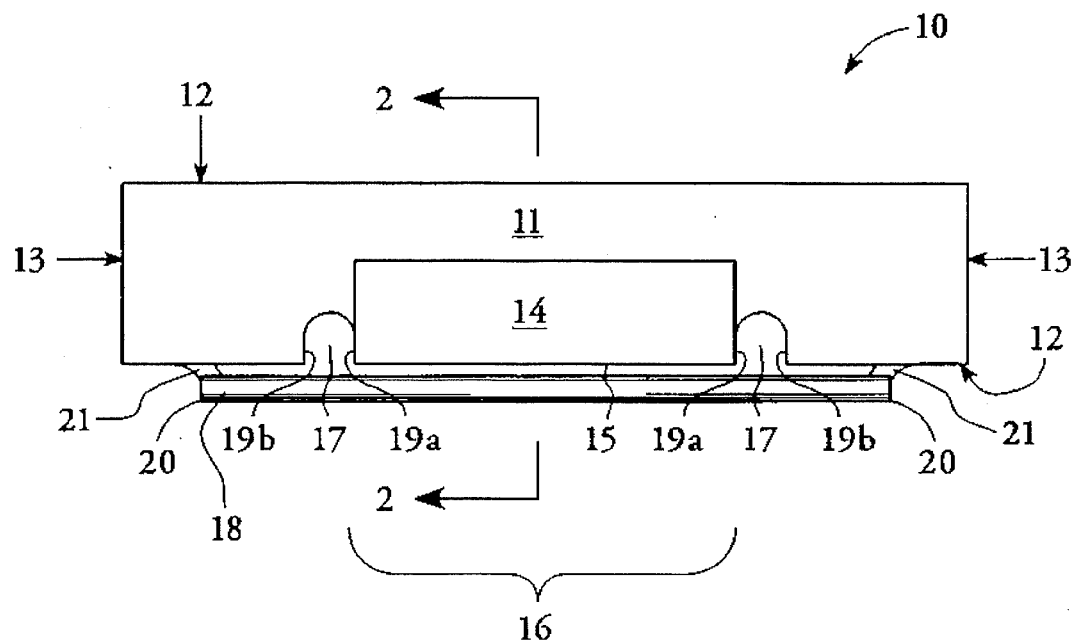
FIG. 1a is a top view of the semiconductor illumination system of the present invention.
Figure 1B:
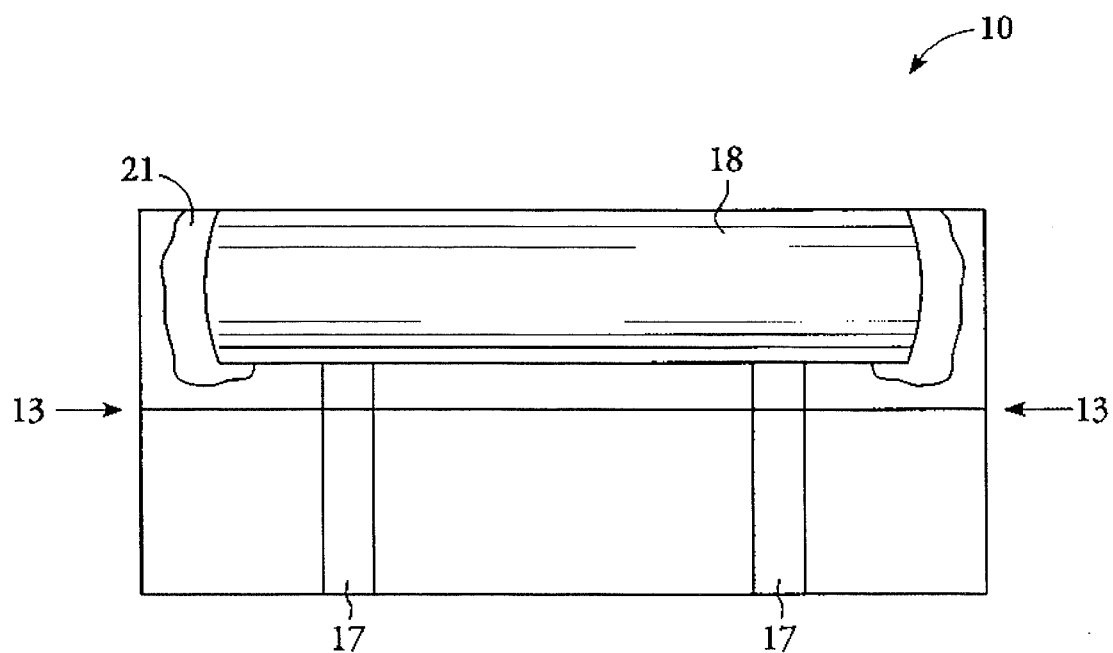
Figure 2:
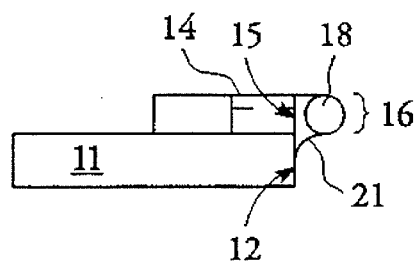
FIG. 2 is a side view of a of the semiconductor illumination system shown in FIG. 1a along 2—2.

With reference to FIGS. 1a and 1b, the illumination system 10, of the present invention includes a monolithic submount 11 that is substantially rectangular in shape with front and back sides 12 being substantially longer than left and right sides 13. Centered along the front side 12 is a light emitting source 14. The light emitting source 14 may be either a laser diode or a laser diode array. Referring to FIG. 2, the front edge 15 of the light emitting source 12 is aligned above the front side 12 so that they form a contiguous vertical plane. The light emitting source 14 defines a radiation path 16, over which the emitted light propagates.

Referring again to FIGS. 1a and 1b, two notches 17 flank the light emitting source 14 and are positioned on either side of the radiation path 16 therefor. Each notch 17 has an inner edge 19a and an outer edge 19b. A cylindrical micro-lens 18 is positioned in the radiation path 16 so that its longitudinal axis is perpendicular thereto, with each of its ends 20 extending beyond an outer edge 19b.

Figure 3:
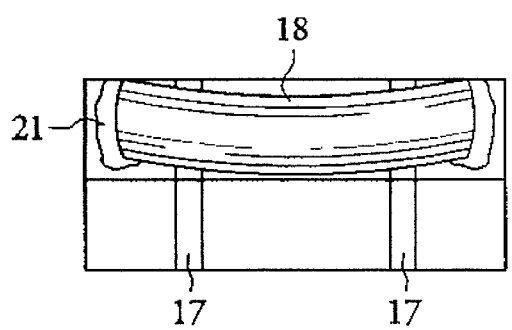
FIG. 3 is a front view of the semiconductor illumination system shown in FIG. 2 wherein the components do not have matching coefficients of expansion.
Figure 4:
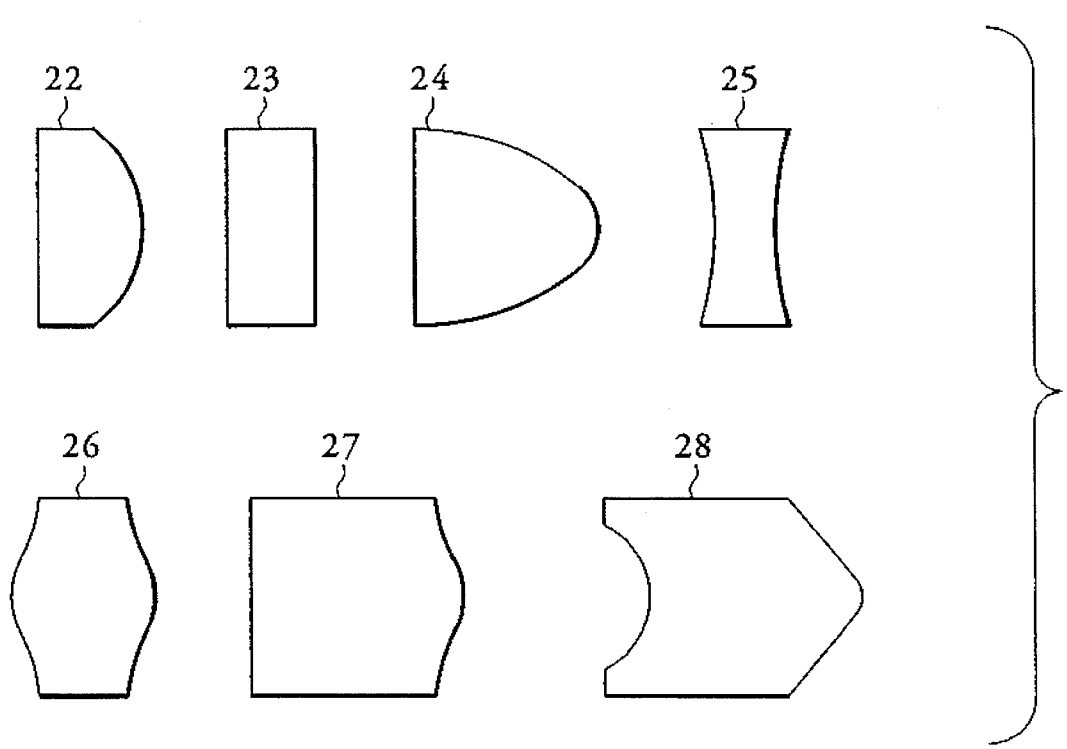
FIG. 4 is a side view of different shaped lenses used in alternate embodiments of the present invention.

Referring to FIG. 4, the micro-lens may be flat 22 and 23, parabolic 24, hyperbolic 25, 26, 27 and 28, spherical 29, elliptical (not shown) or toroidal (not shown), wherein it may or may not be symmetric with respect to the optical axis. However, in the preferred embodiment, the cross-sectional area of the micro-lens 18 is circular, e.g., it is a cylinder, as shown in FIGS. 1–3.

Referring again to FIGS. 1 and 2, the ends 20 of the micro-lens 18 are attached to the submount 11. Any suitable means may be used to attach the micro-lens 18 to the submount 11, such as adhesives or soldering. The preferred embodiment uses epoxy 21 to attach the micro-lens 18 to the submount 11. With this configuration, the notches 17 prevent epoxy from extending into the radiation path 16. If, instead, soldering is used to attach the micro-lens 18, the notches also function to thermally isolate the soldering region from the rest of the submount 11.

Further, it is preferred that the micro-lens 18 and the submount 11 be manufactured from materials having matching coefficients of thermal expansion (CTE). Use of materials having matching CTE prevents misalignment of the system's components, e.g., sagging of the micro-lens, as shown in FIG. 3, due to one component expanding or reducing to a greater extent than the remaining components, referred to as an expansion mismatch. This is usually a result of the system 10 being exposed to temperature changes as the laser source 14 cycles on and off. When this occurs, the micro-lens 18 may droop below the radiation path 16, resulting in misalignment and a loss of illumination intensity or change in beam direction. Also, mismatched components can cause a change in the focal length, i.e., the distance between the micro-lens and the light emitting source 14. This blurs the focus of the beam emitted from the micro-lens 18. Determining whether various materials have matching CTE is a function of the dimension of the components made from them and the change in temperature to which those components are subjected. For example, fixing the length of micro-lens 18 to 1 cm, the acceptable expansion mismatch between the micro-lens 18 and the mount 11 is 1.5 μm, for an illumination system placed in non-operational storage. In other words, the system 10 efficiency will not degrade so long as the dimensions of the micro-lens 18 do not change 1.5 μm in excess of the change in the submount's 11 dimensions. Over a range of temperature changes, what is found is that the difference between the CTE of the materials used to manufacture the afore-described system is inversely proportional to the change in temperature. The following demonstrates this finding:

| ΔT | ΔCTE Permitted to maintain an expansion match of 1.5 μm or less |
|---|---|
| 10° C. | $15.0 \times 10^{-6}/°C.$ |
| 20° C. | $7.5 \times 10^{-6}/°C.$ |
| 30° C. | $5.0 \times 10^{-6}/°C.$ |
| 50° C. | $3.0 \times 10^{-6}/°C.$ |
| 75° C. | $2.0 \times 10^{-6}/°C.$ |

In the preferred embodiment, submount 11 is manufactured from Copper-Tungsten (Cu—W) and a 1 cm micro-lens 18 is constructed from $F_2$. $F_2$ is a specific type of flint glass manufactured by Schott, Inc. The CTE of $F_2$ is $8.2 \times 10^{-6}/°$ C., and the CTE of the Cu—W is $6.8 \times 10^{-6}/°$ C., providing a ΔCTE of $1.4 \times 10^{-6}/°$ C. The ΔCTE is defined as the absolute value of the difference between the coefficient of thermal expansion of any two materials. This embodiment has proved highly stable notwithstanding thermal cycling. An illumination system manufactured in accordance with the preferred embodiment passed a non-operational temperature cycling test wherein the system was cycled from −54° C. to 71° C. for twelve hours at 6 minutes per cycle. The system subsequently performed without degradation in efficiency. Illumination systems have performed, as described above, with the submount and micro-lens manufactured from materials having coefficients of thermal expansion matching to within 30% of one another. However, the preferred embodiment requires that the components be manufactured from materials having an absolute ΔCTE ranging from 0 to $5 \times 10^{-6}/°$ C.

It has also been found that a high index micro-lens, manufactured from Sapphire having a CTE from 5 to $5.6 \times 10^{-6}/°$ C., could be employed with a submount manufactured from Gallium-Arsenide (GaAs) having a CTE of $6.5 \times 10^{-6}/°$ C., as well as a silica micro-lens, having a CTE of $0.5 \times 10^{-6}/°$ C. mounted on a diamond submount, having a CTE of $1 \times 10^{-6}/°$ C. In addition, the submount 11 has been manufactured from other materials including GaP, having a CTE $5.9 \times 10^{-6}/°$ C.; $Al_2O_3$, having a CTE $6.7 \times 10^{-6}/°$ C.; Cu—W, having a CTE $6.5 \times 10^{-6}/°$ C.; Ge, having a CTE $5.92 \times 10^{-6}/°$ C.; and AlAs, having a CTE $5.2 \times 10^{-6}/°$ C. Similarly, the micro-lens may be manufactured from numerous materials including LASFN 31, having a CTE $6.8 \times 10^{-6}/°$ C.; SF13, having a CTE $7.1 \times 10^{-6}/°$ C.; $F_1$, having a CTE $8.7 \times 10^{-6}/°$ C.; F7, having a CTE $7.7 \times 10^{-6}/°$ C.; and $BASF_{55}$, having a CTE $5.1 \times 10^{-6}/°$ C., all manufactured by Schott, Inc.

We claim:

1. An optical assembly comprising, a structural member having a first coefficient of thermal expansion, said structural member including a means for producing a beam of light, thereby defining a radiation path, a micro-lens having a second coefficient of thermal expansion and an axis, said axis being oriented substantially perpendicular to and positioned in said radiation path, said second coefficient of thermal expansion and said first coefficient of thermal expansion defining a difference, the absolute value being less than $5 \times 10^{-6}/°$ C., and means for rigidly attaching said micro-lens to said structural member at points spaced apart and located on opposite sides of said means for producing said beam of light.

2. An optical assembly as recited in claim 1 wherein said micro-lens has a substantially cylindrical shape and said structural member includes two spaced apart notches each disposed on opposite sides of the means for producing a beam of light.

3. An optical assembly as recited in claim 2 wherein said structural member is manufactured from copper-tungsten and said micro-lens is comprised of sapphire.

4. An optical assembly as recited in claim 2 wherein said structural member is comprised of copper-tungsten, and said micro-lens is comprised of flint glass with a coefficient of thermal expansion wherein the flint glass coefficient of thermal expansion and the copper-tungsten coefficient of thermal expansion define a difference, the absolute value being less than $3 \times 10^{-6}/°$ C.

5. An optical assembly as recited in claim 4 wherein said light producing means is a compound selected from the III–V groups of elements.

6. An optical assembly as recited in claim 2 wherein said structural member is comprised of gallium-arsenide and said micro-lens is comprised of sapphire.

7. An optical assembly as recited in claim 1 wherein said means for producing said light beam is a semiconductor compound selected from the III–V groups of elements and wherein said micro-lens is comprised of a semiconductor compound which is transparent to said radiation.

8. An optical assembly as recited in claim 1 wherein said structural member is a semiconductor crystal selected from the group of GaP or Ge.

9. An optical assembly comprising, a structural member having a first coefficient of thermal expansion, emitting means for producing a beam of light and having a second coefficient of thermal expansion, said emitting means mounted to said structural member, thereby defining a radiation path for said beam, a micro-lens having a third coefficient of thermal expansion and an axis, said axis being oriented substantially perpendicular to and positioned in said radiation path, said micro-lens attached by bonding material, at points lying outside of said radiation path, to said structural member, and notch means, formed relative to said structural member on adjacent sides of said radiation path, for preventing encroachment of said bonding material into said radiation path, said notch means having a longitudinal axis extending transverse to said micro-lens axis.

10. An optical assembly comprising, a structural member having a first coefficient of thermal expansion, emitting means for producing a beam of light and having a second coefficient of thermal expansion, said emitting producing means mounted to said structural member, thereby defining a radiation path for said beam, said radiation path being flanked by a receptive means, formed relative to said structural member, for preventing degradation of intensity of said beam, and a micro-lens having a third coefficient of thermal expansion and an axis, said axis being oriented substantially perpendicular to and positioned in said radiation path, and said micro-lens being rigidly attached, at points lying outside of said radiation path, to said structural member, wherein said emitting means for producing said light beam is a semiconductor compound selected from the III–V groups of elements and wherein said micro-lens is comprised of a semiconductor compound which is transparent to said radiation.

11. An optical assembly comprising, a structural member formed from a semiconductor crystal selected from the group of GaP or Ge and has a first coefficient of thermal expansion, emitting means for producing a beam of light and having a second coefficient of thermal expansion, said emitting producing means mounted to said structural member, thereby defining a radiation path for said beam, said radiation path being flanked by a receptive means, formed relative to said structural member, for preventing degradation of intensity of said beam, and a micro-lens having a third coefficient of thermal expansion and an axis, said axis being oriented substantially perpendicular to and positioned in said radiation path, and said micro-lens being rigidly attached, at points lying outside of said radiation path, to said structural member.

12. An optical assembly comprising, a structural member having a first coefficient of thermal expansion, emitting means for producing a beam of light and having a second coefficient of thermal expansion, said emitting producing means mounted to said structural member, thereby defining a radiation path for said beam, said radiation path being flanked by a receptive means, formed relative to said structural member, for preventing degradation of intensity of said beam, and a micro-lens having a third coefficient of thermal expansion and an axis, said axis being oriented substantially perpendicular to and positioned in said radiation path, and said micro-lens being rigidly attached, at points lying outside of said radiation path, to said structural member, wherein said second coefficient of thermal expansion and said first coefficient of thermal expansion define a difference, the absolute value being less than $5\times10^{-6}/°$ C., said third coefficient of thermal expansion and said first coefficient of thermal expansion defining a difference, the absolute value being less than $5\times10^{-6}/°$ C., said second coefficient of thermal expansion and said third coefficient of thermal expansion define a difference, the absolute value being less than $5\times10^{-6}/°$ C.

13. An optical assembly as recited in claim 12 wherein said structural member has a substantially planar front surface, said emitting producing means being mounted coplanar with said front surface, said ends being rigidly attached, beyond said radiation path, to said structural member with bonding material.

14. An optical assembly as recited in claim 12 wherein said receptive means comprises two notches flanking said radiation path and integrally formed with said structural member to prevent bonding material from obstructing said radiation path upon mounting beam emitting producing means on said structural member.

15. An optical assembly as recited in claim 12 wherein said micro-lens is substantially cylindrical in shape.

16. An optical assembly as recited in claim 15 wherein said structural member is comprised of copper-tungsten, and said micro-lens is comprised of a flint glass with a coefficient of thermal expansion substantially matching that of copper-tungsten.

17. An optical assembly as recited in claim 16 wherein said emitting producing means is a semiconductor compound selected from the III–V groups of elements.

18. An optical assembly as recited in claim 15 wherein said structural member is comprised of gallium-arsenide and said micro-lens is comprised of sapphire.

19. An optical assembly as recited in claim 18 wherein said structural member is manufactured from copper-tungsten.

20. An optical assembly as recited in claim 12 wherein said micro-lens is substantially hyperbolic in shape.

21. An optical assembly as recited in claim 12 wherein said micro-lens is a flat lens.

22. An optical assembly as recited in claim 12 wherein said micro-lens is spherical.

23. An optical assembly as recited in claim 12 wherein said micro-lens is non-spherical.

24. An optical assembly comprising, a structural member having a planar front surface and a first coefficient of thermal expansion, means for producing a beam of light having a plurality of emitter regions and a second coefficient of thermal expansion, said producing means being mounted to said structural member so that said plurality of emitter regions are coplanar with said front surface, thereby defining a radiation path, said second coefficient of thermal expansion and said first coefficient of thermal expansion defining a difference, the absolute value being less than $3\times10^{-6}/°$ C., said radiation path being flanked by two notches integrally formed with said structural member to prevent bonding material from obstructing said radiation path, each said notch having an inner edge and an outer edge, each said inner edge forming a boundary of said radiation path, and a micro-lens having a third coefficient of thermal expansion and an axis oriented substantially perpendicular and positioned in said radiation path, each end of said micro-lens being rigidly attached to said structural member proximate said outer edge, said third coefficient of thermal expansion and said first coefficient of thermal expansion defining a difference, the absolute value being less than $3 \times 10^{-6}/°$ C., said second coefficient of thermal expansion and said third coefficient of thermal expansion defining a difference, the absolute value being less than $3 \times 10^{-6}/°$ C.

25. An optical assembly as recited in claim 24 wherein said micro-lens is substantially cylindrical in shape.

26. An optical assembly as recited in claim 25 wherein said structural member is comprised of copper-tungsten and said micro-lens is comprised of a flint glass with a coefficient of thermal expansion substantially matching that of copper-tungsten.

27. An optical assembly as recited in claim 26 wherein said light producing means is a semiconductor compound selected from the III–V groups of elements.

28. An optical assembly as recited in claim 25 wherein said structural member is comprised of gallium-arsenide and said micro-lens is comprised of sapphire.

29. An optical assembly as recited in claim 28 wherein said structural member is manufactured from copper-tungsten.

30. An optical assembly as recited in claim 24 wherein said means for producing said light beam is a semiconductor compound selected from the III–V groups of elements and wherein said micro-lens is comprised of a semiconductor compound which is transparent to said radiation.

31. An optical assembly as recited in claim 24 wherein said structural member is a semiconductor crystal selected from the group of GaP or Ge.

* * * * *